(12) United States Patent
Kjellström

(10) Patent No.: US 11,133,731 B2
(45) Date of Patent: Sep. 28, 2021

(54) PRINTED CIRCUIT BOARD AND ELECTRIC FILTER

(75) Inventor: Claes Kjellström, Hälleblacka (SE)

(73) Assignee: Aktiebolaget Electrolux

( * ) Notice: Subject to any disclaimer, the term of this patent is extended or adjusted under 35 U.S.C. 154(b) by 1330 days.

(21) Appl. No.: 14/409,525

(22) PCT Filed: Jun. 28, 2012

(86) PCT No.: PCT/EP2012/062563
§ 371 (c)(1),
(2), (4) Date: Dec. 19, 2014

(87) PCT Pub. No.: WO2014/000800
PCT Pub. Date: Jan. 3, 2014

(65) Prior Publication Data
US 2015/0327356 A1    Nov. 12, 2015

(51) Int. Cl.
*H02K 11/02* (2016.01)
*H05K 1/02* (2006.01)
(Continued)

(52) U.S. Cl.
CPC ............... *H02K 11/02* (2013.01); *A47L 9/28* (2013.01); *H02K 11/0094* (2013.01);
(Continued)

(58) Field of Classification Search
CPC .. H05K 1/0231; H05K 1/0233; H05K 1/0215; H05K 1/0218; H05K 1/0203;
(Continued)

(56) References Cited

U.S. PATENT DOCUMENTS

| | | | |
|---|---|---|---|
| 4,673,851 A | 6/1987 | Disser | |
| 5,664,282 A * | 9/1997 | Castwall | A47L 5/22 15/319 |

(Continued)

FOREIGN PATENT DOCUMENTS

| | | |
|---|---|---|
| CN | 1645991 A | 7/2005 |
| CN | 1774959 A | 5/2006 |

(Continued)

OTHER PUBLICATIONS

First Chinese Office Action for Chinese Application No. 201280074136. 6, dated Feb. 3, 2017, including English translation, 18 pages.
(Continued)

*Primary Examiner* — Tran N Nguyen
*Assistant Examiner* — Leda T Pham
(74) *Attorney, Agent, or Firm* — RatnerPrestia

(57) ABSTRACT

A printed circuit board and an electric filter. The printed circuit board is arranged to accommodate an electric circuitry on one side, and an electrically conductive material on the other side which forms a common ground point with the electric circuitry and a device contacting the conductive material. The electric filter for filtering electric signals of a DC motor includes a freewheeling diode coupled in parallel to the motor, a capacitor coupled in parallel to the motor, where a ground terminal of the capacitor is coupled to a chassis of the motor, a low pass filter including a ferrite bead and another capacitor is connected to each motor terminal (M+, M−), and a resistor-capacitor filter is coupled in parallel to the motor.

11 Claims, 4 Drawing Sheets

(51) Int. Cl.
*H02K 11/00* (2016.01)
*A47L 9/28* (2006.01)

(52) U.S. Cl.
CPC ......... *H05K 1/0203* (2013.01); *H05K 1/0215* (2013.01); *H05K 1/0218* (2013.01); *H05K 1/0231* (2013.01); *H05K 1/0233* (2013.01); *H05K 2201/0715* (2013.01); *H05K 2201/09027* (2013.01); *H05K 2201/09063* (2013.01)

(58) Field of Classification Search
CPC . H05K 2201/0715; H05K 2201/09027; H05K 2201/06093; H02K 11/0094; H02K 11/01
See application file for complete search history.

(56) References Cited

U.S. PATENT DOCUMENTS

| | | | |
|---|---|---|---|
| 6,173,883 | B1 | 1/2001 | Gorenz, Jr. et al. |
| 7,019,425 | B2* | 3/2006 | Langguth ............. H02K 11/024 310/220 |
| 7,061,094 | B2 | 6/2006 | Takahashi et al. |
| 7,443,693 | B2 | 10/2008 | Arnold et al. |
| 8,248,822 | B2* | 8/2012 | Lu .................. H05K 9/0026 174/350 |
| 9,072,183 | B2* | 6/2015 | Mawhinney ............ H02K 5/145 |
| 2002/0030415 | A1* | 3/2002 | Morooka ................ H02K 5/08 310/68 R |
| 2005/0017584 | A1 | 1/2005 | Langguth et al. |
| 2005/0214135 | A1* | 9/2005 | Shibuya .............. F04D 29/0465 417/357 |
| 2006/0017454 | A1 | 1/2006 | Bhatti |
| 2012/0044663 | A1 | 2/2012 | Lu et al. |
| 2015/0091401 | A1* | 4/2015 | Buerger ................ H02K 5/225 310/71 |
| 2015/0155765 | A1* | 6/2015 | Zenowich ............. H02K 5/225 310/71 |

FOREIGN PATENT DOCUMENTS

| | | |
|---|---|---|
| CN | 1783631 A | 6/2006 |
| EP | 0384301 A2 | 8/1990 |
| EP | 0534372 A1 | 3/1993 |
| EP | 1780867 | 5/2007 |

OTHER PUBLICATIONS

"DC motor design with X2Y technology," Johanson Dielectrics, Apr. 29, 2005, pp. 1-17.

"X2Y in EMI filter devices for appliances," X2Y Technology in Balance, Nov. 1, 2008, pp. 1-6.

International Search Report for International Application No. PCT/EP2012/062563 dated Apr. 18, 2013.

Muccioli, J. et al., "Suppression techniques using X2Y as a broadband EMI filter," 2003 IEEE International Symposium on EMC, Aug. 23, 2003, pp. 1-31.

European Communication for European Application No. 12 731 420.1, dated Jul. 10, 2018, 9 pages.

European Communciation for European Application No. 12731420.1, dated Nov. 19, 2020, 11 pages.

\* cited by examiner

PRINTED CIRCUIT BOARD AND ELECTRIC FILTER

This application is a U.S. National Phase application of PCT International Application No. PCT/EP2012/062563, filed Jun. 28, 2012, the entire disclosure of which is expressly incorporated by reference herein.

TECHNICAL FIELD

The present invention relates to a printed circuit board and an electric filter.

BACKGROUND

In electric devices arranged with electric motors, such as household appliances in the form of e.g. vacuum cleaners, requirements pertaining to motor noise and electromagnetic interference (EMI) are strict. These requirements are for instance set forth in standard BS EN 55014-2:1997.

It is thus a general problem in the art in the field of household appliances to provide products which are acceptable from a noise and EMI viewpoint.

SUMMARY

An object of the present invention is to solve, or at least mitigate this problem in the art and provide an improved printed circuit board and electric filter for removing noise emission of a motor.

This object is attained in a first aspect of the present invention by a printed circuit board arranged to accommodate electric circuitry on one side, the other side of the printed circuit board being arranged with an electrically conductive material via which a ground point common to the electric circuitry and a device contacting the conductive material is accomplished.

Advantageously, by arranging one side of the board for accommodating electric circuitry exemplified in the form of an electric filter for filtering electric signals of a direct current (DC) motor, and the other side of the board with a conductive material via which a ground point common the electric filter and a chassis of the motor is accomplished, grounding problems for the electric filter are overcome, or at least considerably mitigated.

In an embodiment of the present invention, the side of the printed circuit board having the conductive material is completely coated with the material in the form of e.g. zinc, copper or any other appropriate conductive material. When setting the coated side of the printed circuit board in contact with the motor chassis, the chassis will act as a shield for noise emissions of the motor, since the printed circuit board is arranged at an end of the motor, which motor typically being cylindrically shaped, and thus completely covers the end of the motor on which it is mounted by means of e.g. soldering.

In a further embodiment of the present invention, since the printed circuit board is mounted directly to the motor chassis, it is advantageous to provide the board with ventholes for dissipating heat from the motor.

In yet a further embodiment of the present invention, the ventholes are circular, which is advantageous since problems relating to standing waves and resonance can be avoided or at least mitigated.

In another embodiment of the present invention, the physical layout of the electric circuitry arranged to be accommodated on the board is such that it is symmetrically arranged around a central axis of the board. This is advantageous since signals passing trough the filter will have the same propagation time, which further reduces noise.

This object is further attained in a second aspect of the present invention by an electric filter for filtering electric signals of a DC motor, which electric filter comprises a freewheeling diode coupled in parallel to the motor, an X2Y capacitor coupled in parallel to the motor, wherein a ground terminal of the X2Y capacitor is coupled to a chassis of the motor, a low pass filter comprising a ferrite bead and a capacitor connected to each motor terminal, and a resistor-capacitor (RC) filter coupled in parallel to the motor.

Advantageously, a freewheeling diode is coupled in parallel to the motor and is used to provide a path for the release of energy stored in the inductive motor when the motor is turned off. As long as the motor is running, the freewheeling diode is reverse-biased with respect to an operating voltage applied to the motor. When the motor is turned off, the diode becomes forward-biased with respect to the inductive motor and will conduct current until the energy stored in the inductive motor is dissipated.

Further advantageous is that the X2Y capacitor is coupled in parallel to the motor, wherein any common-mode noise appearing on the motor terminals advantageously is filtered to the common ground formed by the motor chassis by the two capacitors comprised in the X2Y capacitor.

A low pass filter comprising a ferrite bead and a capacitor is coupled to each motor terminal. A ferrite bead is an inductor which is constructed to become highly resistive at a design frequency range and current induced in the bead is advantageously dissipated as heat instead of inducing an opposing current back in the electric filter, as in the case of the inductive motor discussed hereinabove.

An RC filter occasionally referred to as an RC snubber, i.e. a resistor coupled in series to a capacitor, is coupled across the motor to advantageously reduce voltage overshoot of the motor. When the motor charges to an intended voltage potential, the remaining energy in leads to the motor continues to charge the motor voltage and causes voltage overshoot, which is sometimes referred to as ringing.

Thus, the electric filter advantageously reduces noise emission of the DC motor, the motor being for example a nozzle motor of an upright vacuum cleaner. Given the strict requirements on motor noise for household appliances, the filter of the present invention facilitates lowering noise levels of the motor such that specified requirements are complied with.

In a further embodiment of the present invention, a printed circuit board assembly is provided. That is, a printed circuit board assembly is provided not only comprising the printed circuit board discussed with reference to the first aspect of the present invention herein above but further the electric filter of the second aspect of the present invention mounted to the printed circuit board. Thus, the electric filter is mounted on one side of the board and ground wiring is performed from that side of the board to the conductive material arranged on the other side of the board, which conductive material is grounded via the motor chassis such that a common ground is accomplished for the electric filter and the motor.

In yet a further embodiment of the present invention, a DC motor arrangement is provided comprising the printed circuit board assembly mounted with the conductive material of the printed circuit board contacting the motor chassis.

In still a further embodiment of the present invention a vacuum cleaner is provided comprising the DC motor arrangement In further embodiments, the DC motor arrangement is arranged in a nozzle of the vacuum cleaner and/or in a fan unit of the vacuum cleaner.

It is noted that the invention relates to all possible combinations of features recited in the claims. Further features of, and advantages with, the present invention will become apparent when studying the appended claims and the following description. Those skilled in the art realize that different features of the present invention can be combined to create embodiments other than those described in the following.

BRIEF DESCRIPTION OF THE DRAWINGS

The invention is now described, by way of example, with reference to the accompanying drawings, in which.

DETAILED DESCRIPTION

The invention will now be described more fully hereinafter with reference to the accompanying drawings, in which certain embodiments of the invention are shown. This invention may, however, be embodied in many different forms and should not be construed as limited to the embodiments set forth herein; rather, these embodiments are provided by way of example so that this disclosure will be thorough and complete, and will fully convey the scope of the invention to those skilled in the art.

Figure 1:
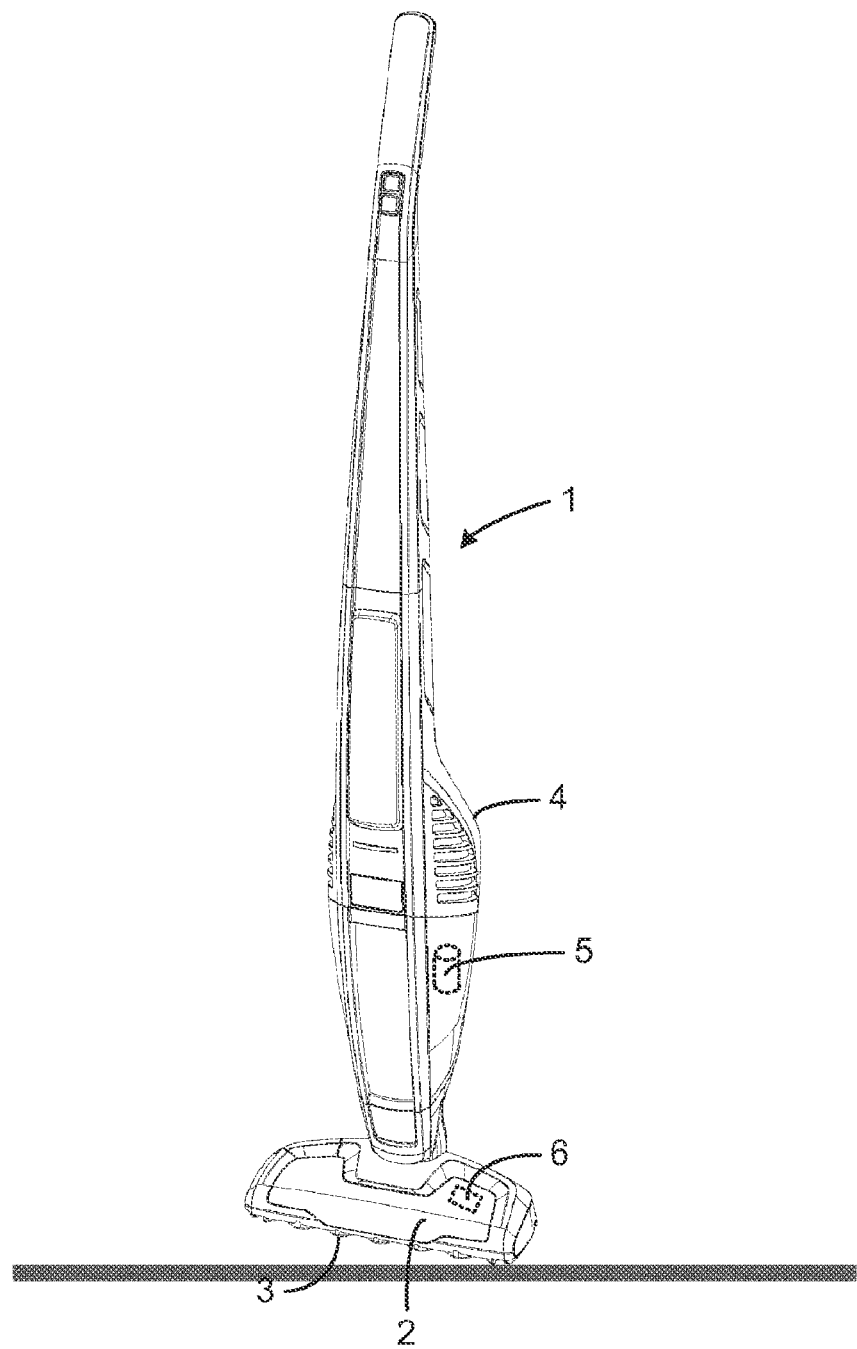
FIG. 1 shows a battery-driven vacuum cleaner of an upright model in which the present invention can be implemented.

FIG. 1 illustrates a battery-driven vacuum cleaner 1 of an upright model comprising a nozzle 2 provided with a rotatable member 3, like a brush roll, for picking up particles from a surface to be cleaned. In a main body 4 of the vacuum cleaner 1, a fan motor 5 generally having the shape of a cylinder is arranged for creating a suction flow such that particles can be transported to a dust bag or container (not shown). Further, as is illustrated with dashed lines, a nozzle motor 6 is arranged in the nozzle for rotating the brush roll 3 such that particles can be picked up from the surface to be cleaned. The present invention can be implemented in the fan motor 5 as well as in the nozzle motor 6. Even though FIG. 1 shows an upright/stick vacuum cleaner, the present invention can be applied in other types of vacuum cleaners, such as e.g. a handheld vacuum cleaner, a robotic vacuum cleaner or a canister vacuum cleaner.

Figure 2:
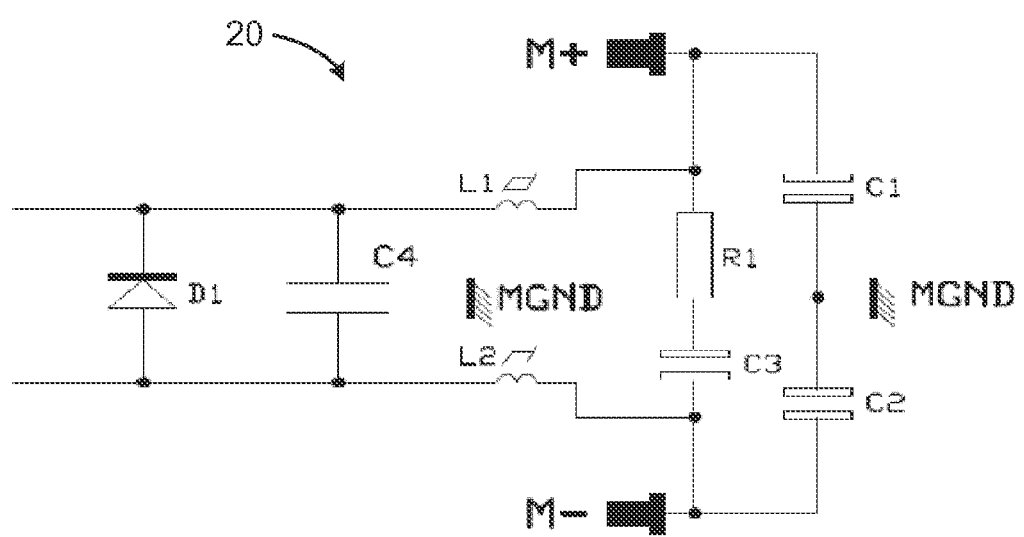
FIG. 2 shows a circuit diagram of an electric filter according to an aspect of the present invention.

FIG. 2 shows a circuit diagram of an electric filter according to an aspect of the present invention, the filter 20 being connected to a DC motor via motor terminals M+ and M−. The filter 20 comprises a freewheeling diode D1 coupled in parallel to the motor, an X2Y capacitor C4 coupled in parallel to the motor, wherein a ground terminal MGND of the X2Y capacitor is coupled to a chassis of the motor, a low pass filter comprising a ferrite bead L1, L2 and a capacitor C1, C2 respectively connected to each motor terminal M+ and M−, and an RC filter consisting of resistor R1 and capacitor C3 coupled in parallel to the motor. As previously has been discussed, the freewheeling diode D1 is used to provide a path for the release of energy stored in the inductive motor when the motor is turned off. As long as the motor is running, the freewheeling diode D1 is reverse-biased with respect to an operating voltage applied to the motor. When the motor is turned off, the diode D1 becomes forward-biased with respect to the inductive motor and will conduct current until the energy stored in the inductive motor is dissipated. To filter common-mode noise appearing on the motor terminals M+ and M− to the ground MGND common to the filter and the motor the X2Y capacitor C4 is used. Further, to dissipate current as heat, the low pass filters of L1, C1 and L2, C2 are connected to the motor terminals M+ and M−, where the inductances L1, L2 are realized in the form of ferrite beads. Finally, the RC filter R1, C3 is used to reduce voltage overshoot—aka. ringing—of the motor.

Figure 3:
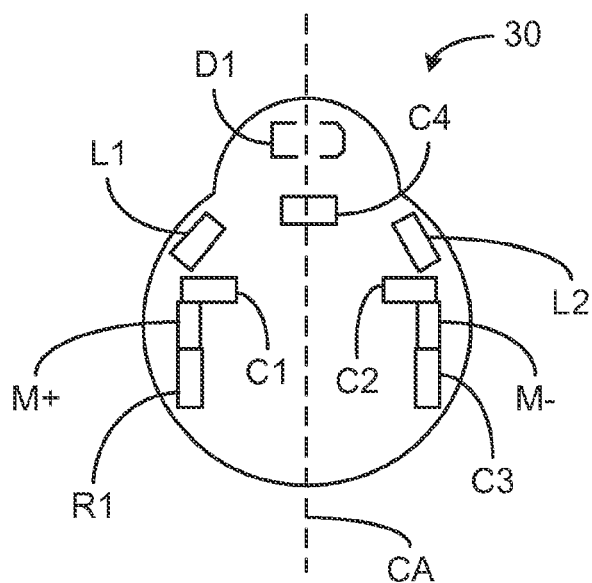
FIG. 3 illustrates a printed circuit board according to a further aspect of the present invention.
Figure 3:
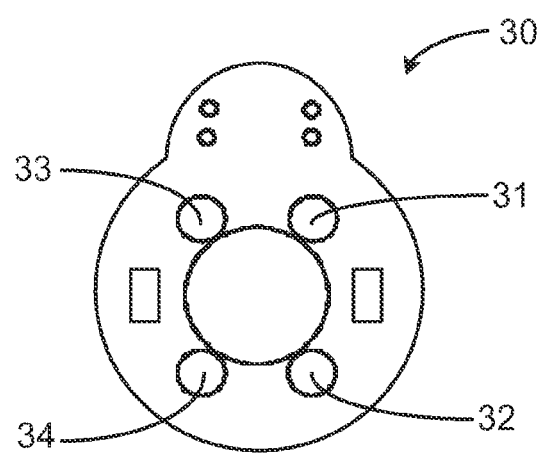

FIG. 3 illustrates a printed circuit board according to a further aspect of the present invention. The top view of FIG. 3 shows one side of the printed circuit board 30 indicating the placement of the electric filter comprising the components D1, C4, L1, L2, R1, C3, C1 and C2 as was discussed in connection to FIG. 2. Thus, the top view of FIG. 3 shows the side of the board 30 arranged to accommodate the electric filter 20 of FIG. 2.

As can be seen in FIG. 3, in an embodiment of the present invention, the physical layout of the filter arranged to be accommodated on the board 30 is such that it is symmetrically arranged around a central axis CA of the board. This is advantageous since signals passing trough the filter will have the same propagation time, which further reduces noise.

The bottom view of FIG. 3 shows the other side of the printed circuit board 30 being arranged with an electrically conductive material via which a ground point common to the electric filter and e.g. a motor chassis on which the board 30 can be mounted is accomplished. In this particular embodiment, the complete side of the board 30 arranged with the conductive material is coated with the material.

In a further embodiment of the present invention, since the printed circuit board 30 is mounted directly to the motor chassis, as will be shown in the following it is advantageous to provide the board with circular ventholes 31, 32, 33 and 34 for dissipating heat from the motor.

Figure 4:
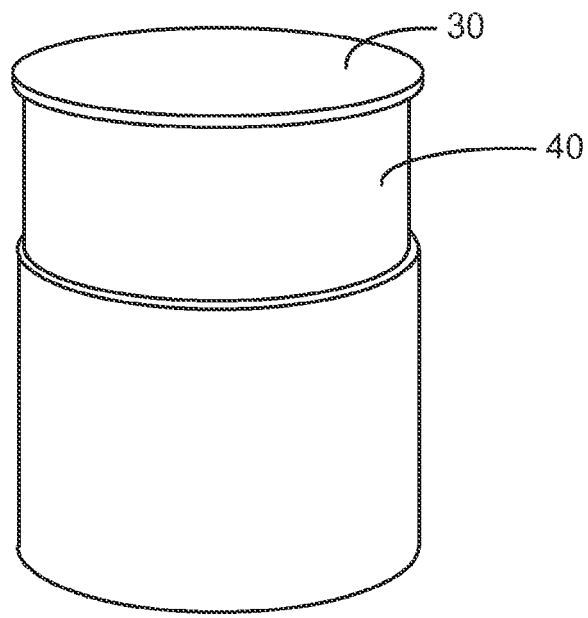
FIG. 4 shows a side view of a vacuum cleaner nozzle motor arranged with a printed circuit board assembly according to an embodiment of the present invention.

FIG. 4 shows a side view of a vacuum cleaner nozzle motor arranged with a printed circuit board assembly according to an embodiment of the present invention comprising the printed circuit board 30 described with reference to FIG. 3 and the electric filter shown in FIG. 2 mounted on the printed circuit board (the filter not being shown in FIG. 4). For a detailed view of the actual placement of filter components onto the board, reference is made to FIG. 3. At one end of the cylindrically shaped motor 40, the side of the printed circuit board 30 being arranged with a conductive material is soldered to the motor chassis to create the common grounding point.

Figure 5:
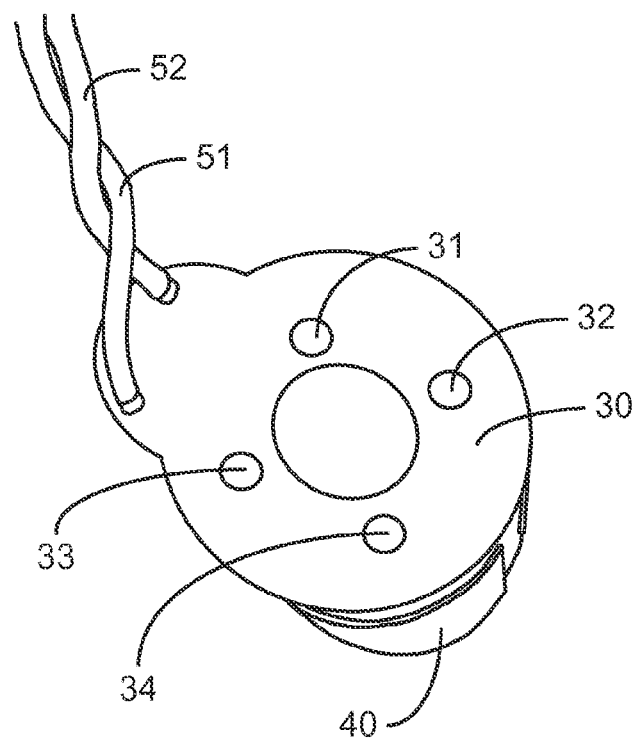

FIG. 5 shows a further view of the vacuum cleaner nozzle motor arranged with the printed circuit board assembly comprising the printed circuit board 30 and the electric filter shown in FIG. 4 (the filter not being shown in FIG. 4), which printed circuit board assembly is mounted to one end of the cylindrically shaped motor 40. Further shown in FIG. 5 are cables 51, 52 connected to the motor terminals such that pulse width modulation (PWM) signals can be supplied for motor control. In an embodiment of the present invention, the cables are intertwined in order to further reduce noise emission. By achieving symmetry in noise for signals transported on the cables, interference may be cancelled due to phase shift of interfering signals. Crosstalk may further be reduced.

Even though the invention has been described with reference to specific exemplifying embodiments thereof, many different alterations, modifications and the like will become apparent for those skilled in the art. The described embodiments are therefore not intended to limit the scope of the invention, as defined by the appended claims.

The invention claimed is:

1. A printed circuit board comprising:
an electric circuitry on a first side of the printed circuit board, and
an electrically conductive material on a second side of the printed circuit board, the second side being opposite the first side, the electrically conductive material forming a common ground point for the electric circuitry and a device contacting the electrically conductive material;
wherein a whole surface of the second side of the printed circuit board is positioned between the first side of the printed circuit board and the device which the printed circuit board is arranged to contact, with the second side of the printed circuit board in direct physical and electrical contact with an electrically-conductive chassis of the device which the printed circuit board is arranged to contact to thereby form an electrical ground point common to the chassis and the printed circuit board.

2. The printed circuit board of claim 1, wherein said second side of the printed circuit board is coated with the electrically conductive material.

3. The printed circuit board of claim 1, wherein the electric circuitry is an electric filter for filtering electrical signals of a direct current (DC) motor.

4. The printed circuit board of claim 1, further being arranged with ventholes for dissipating heat from the device arranged to contact the electrically conductive material.

5. The printed circuit board of claim 4, wherein the ventholes are circular.

6. The printed circuit board of claim 1, wherein the electric circuitry is symmetrically arranged around a central axis (CA) of the printed circuit board.

7. A printed circuit board assembly comprising:
a printed circuit board comprising:
an electric circuitry on a first side of the printed circuit board configured as an electric filter for filtering electric signals of a DC motor, and
an electrically conductive material on a second side of the printed circuit board, the second side being opposite the first side, the electrically conductive material forming a common ground point for the electric circuitry and a device contacting the electrically conductive material,
wherein the device contacting the electrically conductive material is the DC motor; and
wherein a whole surface of the second side of the printed circuit board is positioned between the first side of the printed circuit board and the DC motor, with the second side of the printed circuit board in direct physical and electrical contact with a chassis of the DC motor to thereby form an electrical ground point common to the chassis and the printed circuit board.

8. The printed circuit board assembly of claim 7, further comprising:
a pair of cables connected to the printed circuit board and connected to motor terminals (M+, M−) of the DC motor for conducting a pulse width modulation (PWM) signal between the printed circuit board and the DC motor, wherein the cables are intertwined with each other.

9. The printed circuit board assembly of claim 7, wherein the printed circuit board assembly and the DC motor are arranged in a vacuum cleaner.

10. The printed circuit board assembly of claim 7, wherein the printed circuit board assembly and the DC motor are arranged in a nozzle of a vacuum cleaner.

11. The printed circuit board assembly of claim 7, wherein the printed circuit board assembly and the DC motor are arranged in a fan unit of a vacuum cleaner.

* * * * *